United States Patent
Pan

(10) Patent No.: US 8,219,046 B2
(45) Date of Patent: Jul. 10, 2012

(54) METHOD AND SYSTEM FOR OBTAINING MAXIMUM GAIN OF A PASSIVE UPCONVERSION MIXER UTILIZED IN A TRANSMITTER

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 437 days.

(21) Appl. No.: 12/477,301

(22) Filed: Jun. 3, 2009

(65) Prior Publication Data

US 2010/0311329 A1   Dec. 9, 2010

(51) Int. Cl.
*H04B 1/04* (2006.01)
*G06F 7/44* (2006.01)

(52) U.S. Cl. ..... 455/118; 455/313; 455/323; 455/127.2; 455/115.1; 327/355; 327/359

(58) Field of Classification Search ................. 455/41.2, 455/112, 115.1, 118, 313, 323
See application file for complete search history.

(56) References Cited

U.S. PATENT DOCUMENTS

| | | | |
|---|---|---|---|
| 6,388,501 B2* | 5/2002 | Chien | 327/355 |
| 7,630,700 B2* | 12/2009 | Vaisanen | 455/313 |
| 7,982,527 B2* | 7/2011 | Dawe et al. | 327/355 |
| 2003/0052727 A1* | 3/2003 | Komurasaki et al. | 327/356 |
| 2007/0111694 A1* | 5/2007 | Lin | 455/313 |
| 2007/0132500 A1* | 6/2007 | Embabi et al. | 327/359 |
| 2010/0297970 A1* | 11/2010 | Pan | 455/127.2 |

OTHER PUBLICATIONS

"RF Globalnet Forums", Internet Article, retrieved on Aug. 29, 2011.*

* cited by examiner

*Primary Examiner* — Duc M Nguyen
(74) *Attorney, Agent, or Firm* — Thomas, Kayden, Horstemeyer & Risley, LLP

(57) ABSTRACT

A RF transmitter is operable to transmit a signal at a frequency specified by the Bluetooth protocol. A passive upconversion mixer, which comprises a pair of MOSFET switches, is utilized inside the RF transmitter. The passive upconversion mixer is operable to receive analog local oscillator (LO) signals to be utilized for controlling operation of each of the pair of MOSFET switches to transmit signals with maximum gain. A MOS threshold voltage $V_{TH}$ and a DC component of a received baseband signal, $V_{BB\_DC}$, are determined for each of the pair of MOSFET switches. The determined $V_{TH}$ and the determined $V_{BB\_DC}$ of the received baseband signal are combined such as $V_{TH}+V_{BB\_DC}$ and compared with a DC component of the received LO signals, $V_{LO\_DC}$. The $V_{LO\_DC}$ is set equal to $V_{TH}+V_{BB\_DC}$, accordingly, to provide maximum gain from the passive upconversion mixer for signal transmission.

20 Claims, 8 Drawing Sheets

METHOD AND SYSTEM FOR OBTAINING MAXIMUM GAIN OF A PASSIVE UPCONVERSION MIXER UTILIZED IN A TRANSMITTER

CROSS-REFERENCE TO RELATED APPLICATIONS/INCORPORATION BY REFERENCE

Not applicable.

FIELD OF THE INVENTION

Certain embodiments of the invention relate to communication systems. More specifically, certain embodiments of the invention relate to a method and system for obtaining maximum gain of a passive upconversion mixer utilized in a transmitter.

BACKGROUND OF THE INVENTION

A wireless transmitter transmit wireless signals via a wireless medium and a wireless communication device comprising a receiver is operable to receive and recover the transmitted wireless signals from the wireless medium. The transmitted wireless signals may be distorted and/or otherwise degraded during transmission over the wireless medium. The distortion and/or degradation may occur as a result of factors comprising channel impairments such as noise, signal interference, intersymbol interference and co-channel interference. Accordingly, the transmitter is generally operable to code and/or otherwise process information contained in the transmitted wireless signals so as to mitigate the effects of any actual and/or perceived channel impairments.

Mobile communication devices, such as cellular telephones, personal digital assistants (PDAs), and other communication devices transmit and/or receive communication signals at various radio frequencies. For efficient communication, associated radio frequencies of the transmitted and/or received communication signals are many times higher than corresponding baseband frequencies.

With the rapid growth of wireless communication devices, semiconductor technology has been scaling down to meet the need of a considerable increase in transceiver integration and a reduction in transceiver cost. The need for lower power consumption and higher circuit densities are realized via lowering supply voltages in logic circuits that utilize these semiconductor technologies.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for obtaining maximum gain of a passive upconversion mixer utilized in a transmitter, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for obtaining maximum gain of a passive upconversion mixer utilized in a transmitter. In accordance with various embodiments of the invention, a passive upconversion mixer may be utilized in a radio frequency transmitter for transmitting a signal at a frequency specified by, for example, 2.4 GHz as specified by the Bluetooth protocol. The passive upconversion mixer is operable to receive an analog local oscillator (LO) signal from a local oscillator. The passive upconversion mixer comprises a pair of MOSFET switches. The received analog LO signal may be utilized to control operation of each of the pair of MOSFET switches, respectively. The passive upconversion mixer is operable to transmit signals with maximum gain of the passive upconversion mixer. A MOS threshold voltage $V_{TH}$ may be determined for each of the pair of MOSFET switches, respectively. The passive upconversion mixer is operable to receive an analog baseband signal to the pair of MOSFET switches with the determined MOS threshold voltage $V_{TH}$. A DC component of the received analog baseband signal, $V_{BB\_DC}$, for each of the pair of MOSFET switches may be determined. A DC component of the received analog LO signals, $V_{LO\_DC}$, may be compared with a combination, for example, a linear combination, of the determined $V_{TH}$ and the determined $V_{BB\_DC}$. The determined DC component of the received analog LO signal may be set to be equal to the combination of the determined MOS threshold voltage $V_{TH}$ and the DC component $V_{BB\_DC}$ of the received analog baseband signal $V_{BB}(t)$ for the transmission of the received analog baseband signal based on the comparison.

Figure 1:
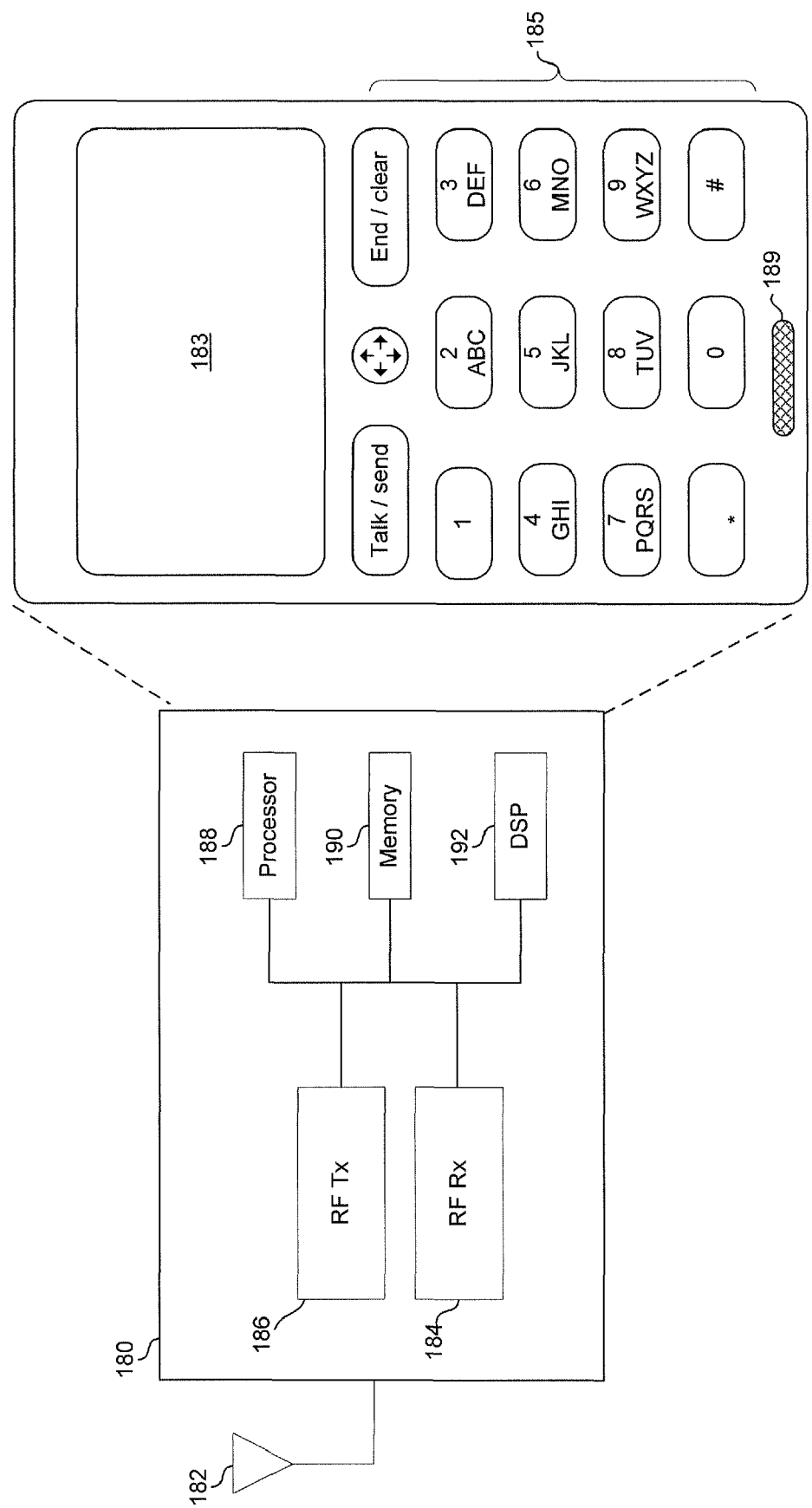
FIG. 1 is a block diagram of an exemplary communication device that utilizes a passive upconversion mixer in a radio frequency (RF) transmitter, in accordance with an embodiment of the invention.

FIG. 1 is a block diagram of an exemplary communication device that utilizes a dedicated power amplifier driver in a radio frequency (RF) transmitter, in accordance with an embodiment of the invention. The communication device 180 may comprise an antenna 182, a radio frequency (RF) receiver (Rx) 184, a radio frequency (RF) transmitter (Tx) 186, a processor 188, a memory 190, a DSP 192, a display 183, user controls 185, a speaker 187, and a microphone 189.

The antenna 182 may be suitable for transmitting and/or receiving electromagnetic signals. Although a single antenna is illustrated, the invention is not so limited. In this regard, the RF Tx/Rx 184 may utilize a common antenna for transmission and reception of signals adhering to one or more wireless standards, may utilize different antennas for each supported wireless standard, and/or may utilize a plurality of antennas for each supported wireless standard.

The RF Rx 184 may comprise suitable logic circuitry and/or code that may be operable to receive data utilizing one or more wired, wireless, and/or optical standards. In various exemplary embodiments of the invention, the RF Rx 184 may be operable to communicate in adherence with cellular, WiMAX, Wi-Fi, Bluetooth, Zigbee, T1/E1, Ethernet, USB, IEEE 1394, analog audio standards, analog video standards, digital audio standards, and/or digital video standards. The radio RF Rx 184 may be operable to perform amplification, down-conversion, filtering, demodulation, and analog to digital conversion of received signals.

The RF Tx 186 may comprise suitable logic circuitry and/or code that may be operable to transmit data utilizing one or more wired, wireless, and/or optical standards. In various exemplary embodiments of the invention, the RF Tx 186 may be operable to communicate in adherence with cellular, WiMAX, Wi-Fi, Bluetooth, Zigbee, T1/E1, Ethernet, USB, IEEE 1394, analog audio standards, analog video standards, digital audio standards, and/or digital video standards. The radio RF Tx 186 may be operable to perform amplification, up-conversion, filtering, modulation, and digital to analog conversion of signals to be transmitted. In this regard, the RF Tx 186 may be operable to utilize a passive upconversion mixer to reduce chip area. The passive upconversion mixer may comprise metal-oxide-semiconductor field-effect transistor (MOSFET) switches. The MOSFET switches may be driven by analog local oscillator (LO) signals from a local oscillator. The operation of the passive upconversion mixer may be controlled by the received LO signals. A maximum gain may be achieved at the passive upconversion mixer by biasing the received analog LO signals. A MOS gate-to-source voltage $V_{gs}$ may be utilized to track MOS threshold voltage $V_{TH}$. The MOS threshold voltage $V_{TH}$ together with a DC component of a received analog baseband signal, $V_{BB\_DC}$, may be utilized to retrieve a bias value of the received LO signal.

The processor 188 may comprise suitable logic, circuitry, and/or code that may enable processing data and/or controlling operations of the communication device 180. In this regard, the processor 188 may be operable to provide control signals to the various other portions comprising the communication device 180. The processor 188 may also control transfers of data between various portions of the communication device 180. Additionally, the processor 188 may enable execution of applications programs and/or code for processing data and effectuating operation of the communication device 180.

The memory 190 may comprise suitable logic, circuitry, and/or code that may enable storage or programming of information comprising parameters and/or code that may effectuate the operation of the communication device 180. Stored information may comprise received data and/or data to be presented, transmitted, and/or otherwise processed. The parameters may comprise configuration data and the code may comprise operational code such as software and/or firmware, but the information need not be limited in this regard.

The DSP 192 may comprise suitable logic, circuitry, and/or code operable to perform computationally intensive processing of data. In various embodiments of the invention, the DSP 192 may encode, decode, transcode, modulate, demodulate, encrypt, decrypt, scramble, descramble, and/or otherwise process data.

The display 183 may be operable to provide visual information to, and/or enable interaction by, a user of the communication device 180. In various embodiments of the invention, a graphical user interface may be presented via the display 183. In various embodiments of the invention, a visual media content such as video, images, and text may be presented via the display 183.

The user controls 185 may be operable to enable user interaction with the communication device 180 to control services and/or content handled by the communication device 180. The user controls 185 may comprise, for example, a keypad, a keyboard, a roller ball, a multidirectional button, a scroll wheels, and/or a touch screen.

The speaker 187 may be operable to present audio information to a user. The speaker may present voice from a phone call and/or music or ringtones played back by the cellular enabled communication device.

The microphone 189 may be operable to convert acoustic signals into electronic signals. The microphone may enable a user to participate in a phone call and/or interact with the cellular enabled communication device via oral input.

In an exemplary operation, the RF Tx 186 may be operable to process digital baseband data such as Bluetooth baseband data, and output to the processor 188, the memory 190, and/or the DSP 192. The digital baseband data may be processed by the processor 188, the memory 190, and/or the DSP 192 to be transmitted to a target receiver. A passive upconversion mixer may be utilized within the RF Tx 186 to reduce chip area. Analog local oscillator (LO) signals may be received and used to drive the passive upconversion mixer. A maximum gain may be achieved at the passive upconversion mixer by biasing the received analog LO signals. A LO bias value may be retrieved by tracking MOS threshold voltage $V_{TH}$ of the passive upconversion mixer and DC component of the received analog baseband signals, $V_{BB\_DC}$.

Figure 2:
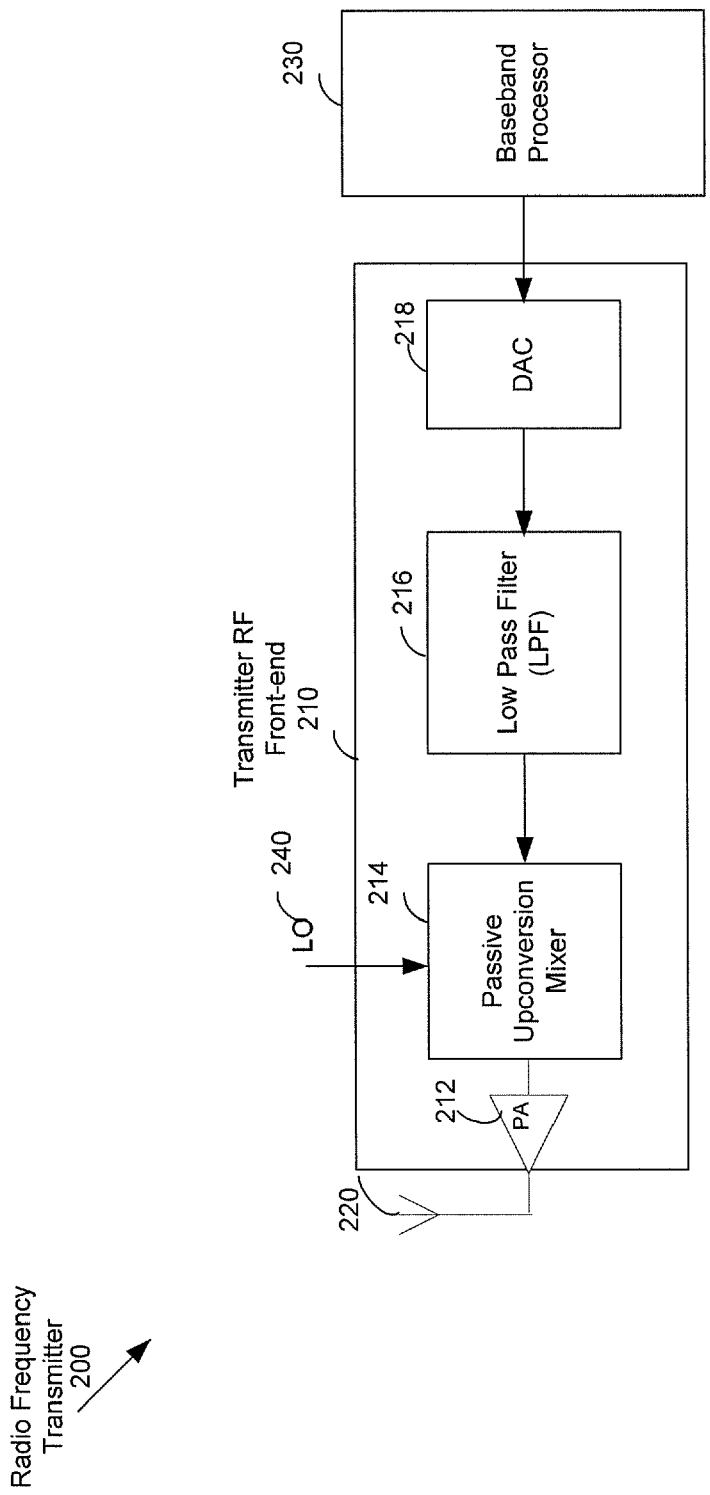
FIG. 2 is a diagram illustrating an exemplary radio frequency (RF) transmitter that utilizes a passive upconversion mixer, in accordance with an embodiment of the invention.

FIG. 2 is a diagram illustrating an exemplary radio frequency (RF) transmitter that utilizes a passive upconversion mixer, in accordance with an embodiment of the invention. Referring to FIG. 2, there is shown a radio frequency transmitter 200 comprising a transmitter RF front-end 210, an antenna 220, a baseband processor 230, and a local oscillator (LO) 240. The transmitter RF front-end 210 comprises a power amplifier (PA) 212, a passive upconversion mixer 214, a lowpass filter (LPF) 216, and a digital-to-analog converter (DAC) 218.

The transmitter RF front-end 210 may comprise suitable logic, circuitry, interfaces and/or code that may be operable to process outbound RF signals and transmit to a target receiver via the antenna 220. The transmitter RF front-end 210 may enable conversion of digital baseband signals from the baseband processor 230 to corresponding RF signals to be amplified via the PA 212 for transmission.

The DAC 218 may comprise suitable logic, circuitry, interfaces and/or code that may be operable to convert received digital baseband signals from the baseband processor 230 to baseband analog signals. The baseband analog signals may be communicated with the LPF 216 for further processing.

The LPF 216 may comprise suitable logic, circuitry and/or code that may be operable to suppress intermediate frequency spurious on the output of the DAC 218. The LPF 216 may be operable to reduce sideband components in the output of the DAC 218. The output of the LPF 216 may be communicated to the passive upconversion mixer 214.

The passive upconversion mixer 214 may comprise suitable logic, circuitry and/or code that may be operable to translate the resulted signals from the LPF 216 to radio frequency signals in conjunction with the local oscillator (LO) 240. The passive upconversion mixer 214 may comprise a switching core. The switching core may comprise a pair of passive metal-oxide-semiconductor field-effect transistor (MOSFET) switches in order to reduce chip area. The pair of the passive MOSFET switches may be driven by using analog LO signals received from the LO 240. The passive upconversion mixer 214 may be operable to achieve a maximum gain by biasing the received analog LO signals. A LO bias value may be determined by evaluating various aspects such as corresponding gate-to-source voltage threshold $V_{TH}$ and DC component of received analog baseband signal, $V_{BB\_DC}$, of the pair of the passive MOSFET switches. The radio frequency signals from the passive upconversion mixer 214 may be communicated with the power amplifier (PA) 212 using maximum gain from the passive upconversion mixer 214.

The PA 212 may comprise suitable logic, circuitry and/or code that may be operable to amplify signals for transmission by using, for example, a Bluetooth protocol in 2.4 GHz. The PA 212 may be driven by the LPF 216 and/or the passive upconversion mixer 214.

The antenna 220 may comprise suitable logic, circuitry and/or code that may be operable to receive and transmit signals in radio frequency (RF) bands. Although the single antenna 220 is illustrated in FIG. 2, the invention may not be so limited. Accordingly, one or more antennas may be utilized for receiving and/or transmitting signals in radio frequency (RF) bands by the radio transceiver 200 without departing from the spirit and scope of various embodiments of the invention.

The baseband processor 230 may comprise suitable logic, circuitry and/or code that may be operable to process digitized baseband signals. The baseband processor 230 may be operable to perform such baseband operations as demodulation, decorrelation, decoding, and error correction. In the event that the digitized baseband signals may need to be transmitted by using, for example, a Bluetooth protocol in 2.4 GHz, the baseband processor 230 may be operable to communicate with the transmitter RF front-end 210 to transmit corresponding signals in radio frequency (RF) bands via the antenna 220.

In an exemplary operation, in instances where the baseband processor 230 may need to transmit digitized baseband signals in a specific radio frequency band such as 2.4 GHz, the baseband processor 230 may communicate the digitized baseband signals with the DAC 218. The DAC 218 may be operable to convert the received digitized baseband signals to corresponding baseband analog signals and communicate with the low pass filter (LPF) 216. The LPF 216 may be operable to suppress sideband components in the received baseband analog signals and communicate to the passive upconversion mixer 214. The passive upconversion mixer 214 may be operable to mix the received baseband analog signals with LO signals to convert the received baseband analog signals to radio frequency signals in the specific radio frequency band. The converted baseband analog signals may be communicated with the PA 212 using maximum gain from the passive upconversion mixer 214. The converted baseband analog signals may be amplified at the PA 212 and communicated with the antenna 220 for transmission, accordingly.

Figure 3:
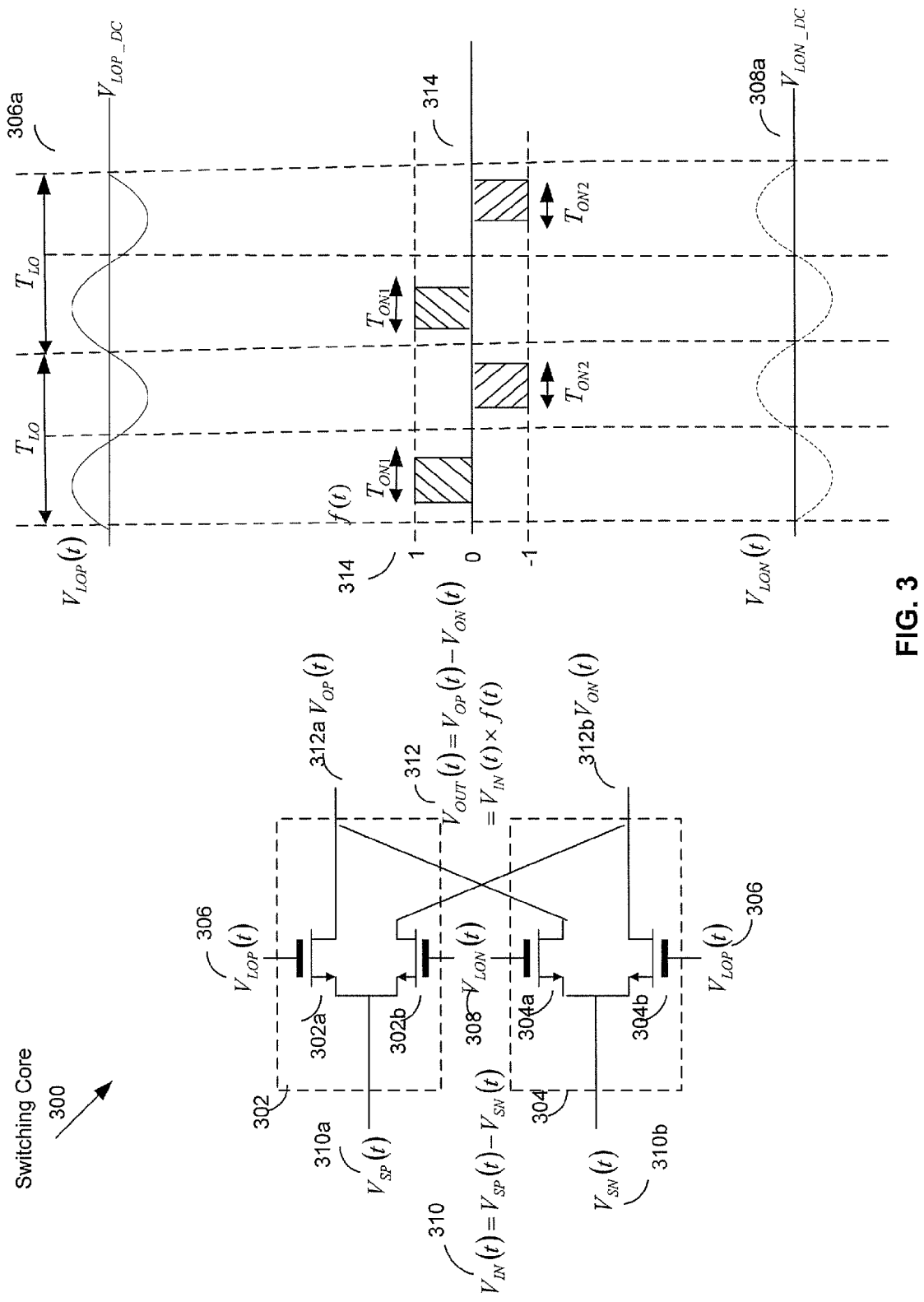
FIG. 3 is a diagram illustrating an exemplary switching core that is utilized in a passive upconversion mixer, in accordance with an embodiment of the invention.

FIG. 3 is a diagram illustrating an exemplary switching core that is utilized in a passive upconversion mixer, in accordance with an embodiment of the invention. Referring to FIG. 3, there is shown a switching core 300 comprising a pair of MOSFET switches 302 and 304. The MOSFET switch 302 comprises a pair of MOS transistor 302a and 302b. The MOSFET switch 304 comprises a pair of MOS transistor 304a and 304b. Gate voltages $V_{LON}(t)$ 306 and $V_{LOP}(t)$ 308 are two path local oscillator (LO) signals from the LO 240, where t is time variable. Gate voltages $V_{LON}(t)$ 306 and $V_{LOP}(t)$ 308 may be expressed, for example, as followings:

$$V_{LOP}(t) = V_{LO\_DC} + AmP_{LO}\sin\left(\frac{2\pi}{T_{LO}}t\right)$$

$$V_{LON}(t) = V_{LO\_DC} - AmP_{LO}\sin\left(\frac{2\pi}{T_{LO}}t\right)$$

where, $V_{LO\_DC}$ is the DC component of gate voltages $V_{LON}(t)$ 306 and $V_{LOP}(t)$ 308. Curve 306a and curve 308a are exemplary graphical expressions for the gate voltages $V_{LON}(t)$ 306 and $V_{LOP}(t)$ 308. $AmP_{LO}$ is an amplitude of the gate voltages $V_{LON}(t)$ 306 and $V_{LOP}(t)$ 308. $T_{LO}$ is a LO cycle associated with the gate voltages $V_{LON}(t)$ 306 and $V_{LOP}(t)$ 308.

Source voltages $V_{SP}(t)$ 310a and $V_{SN}(t)$ 310b are two voltages for baseband I and Q path signals input to the passive upconversion mixer 214 via the LPF 216, where t is time variable. Exemplary expressions for source voltages $V_{SP}(t)$ 310a and $V_{SN}(t)$ 310b may be represented as followings:

$$V_{SP}(t) = V_{BB\_DC} + AmP_S\sin\left(\frac{2\pi}{T_{BB}}t\right)$$

$$V_{SN}(t) = V_{BB\_DC} - AmP_S\sin\left(\frac{2\pi}{T_{BB}}t\right)$$

where, $V_{BB\_DC}$ is the DC components of baseband signals. $AmP_S$ is the amplitude of a source signal of, for example, the MOSFET switch 302. $T_{BB}$ is an associated baseband (BB) cycle signal to the MOSFET switch 302. Input voltage $V_{IN}(t)$ 310 is an input voltage of the switching core 300. The input voltage $V_{IN}(t)$ 310 is expressed as $V_{IN}(t)=V_{SP}(t)-V_{SN}(t)$. The output voltages $V_{OP}(t)$ 312a and $V_{ON}(t)$ 312b are two output voltage signals from the MOSFET switch 302 and the MOSFET switch 304, respectively. Output voltage $V_{OUT}(t)$ 314 of the switching core 300 is expressed as $V_{OUT}(t)=V_{OP}(t)-V_{ON}(t)=V_{IN}(t)\times f(t)$, where $f(t)\in\{-1,0,+1\}$ 316 is a transfer function and is a pulse train function as illustrated in FIG. 3. Referring to FIG. 3, $T_{ON1}$ and $T_{ON2}$ are pulse durations for pulse value of 1 and −1 respectively.

In an exemplary operation, in the first half of the LO cycle of the output voltage $V_{OUT}(t)$ 314, in instances when the MOSFET switch 302a is ON, the MOSFET switch 304a is OFF, the MOSFET switch 302b is OFF and the MOSFET switch 304b is ON, $V_{OUT}(t)=V_{OP}(t)-V_{ON}(t)=(V_{SP}(t)-V_{SN}(t))(+1)=V_{IN}(t)\times(+1)$. In instances when the MOSFET switch 302a is OFF, the MOSFET switch 304a is OFF, the MOSFET switch 302b is OFF and the MOSFET switch 304b is OFF, $V_{OUT}(t)=V_{OP}(t)-V_{ON}(t)=0=V_{IN}(t)\times(0)$. In the second of the half LO cycle of the output voltage $V_{OUT}(t)$ 314, in instances when the MOSFET switch 302a is OFF, the MOSFET switch 304a is ON, the MOSFET switch 302b is ON and the MOSFET switch 304b is OFF, $V_{OUT}(t)=V_{OP}(t)-V_{ON}(t)=(V_{SN}(t)-V_{SP}(t))(+1)=(V_{SP}(t)-V_{SN}(t))\times(-1)=V_{IN}(t)\times(-1)$. In instances when the MOSFET switch 302a is OFF, the MOS- FET switch 304a is OFF, the MOSFET switch 302b is OFF and the MOSFET switch 304b is OFF, $V_{OUT}(t)=V_{OP}(t)-V_{ON}(t)=0=V_{IN}(t)\times(0)$.

Figure 4:
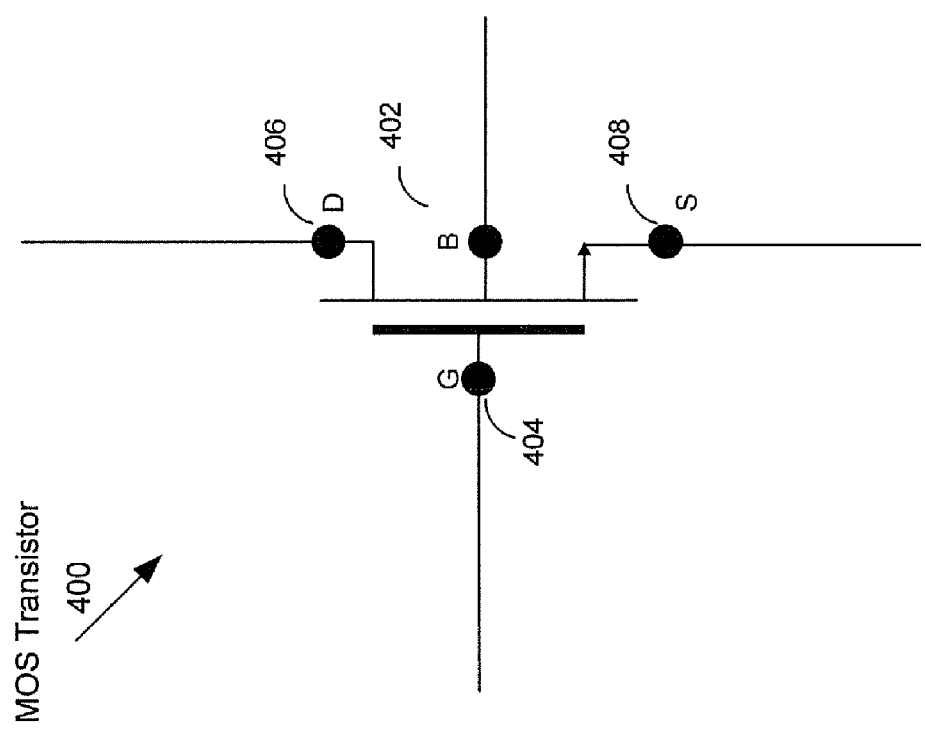
FIG. 4 is a diagram illustrating an exemplary MOS transistor circuit schematic, in accordance with an embodiment of the invention.

FIG. 4 is a diagram illustrating an exemplary MOS transistor circuit schematic, in accordance with an embodiment of the invention. Referring to FIG. 4, there is shown a MOS transistor 400 comprising a body (B) region 402, a gate (G) terminal 404, a drain (D) terminal 406, and a source (S) terminal 408.

The operation of the MOS transistor 400 may depend on various MOS transistor variables such as a gate voltage $V_G$, a source voltage $V_S$, and/or a MOS voltage threshold $V_{TH}$. For example, the drain (D) terminal 406 is connected to the source (S) terminal 408 when $V_G-V_S>V_{TH}$. The MOS transistor 400 may be turned ON. The drain (D) terminal 406 is disconnected to the source (S) terminal 408 when $V_G-V_S \leq V_{TH}$. The MOS transistor 400 may be turned OFF.

The operation of the MOS transistor 400 may vary depending on the voltage levels at associated terminals such as a gate voltage $V_G$ and/or a source voltage $V_S$ with respect to MOS threshold voltage $V_{TH}$. For example, when $V_G-V_S \leq V_{TH}$, the MOS transistor 400 may be turned OFF, and there is no conduction between the drain terminal 406 and the source terminal 408. When $V_G-V_S>V_{TH}$, the MOS transistor 400 is turned ON, and a channel has been created which allows current to flow between the drain terminal 406 and the source terminal 408. The MOS transistor 400 may operate like a resistor, controlled by the gate voltage $V_G$ relative to both a source voltage $V_S$ and a drain voltage $V_D$. The body region 402 may be operated as a second gate, and is sometimes referred to as the "back gate".

The performance of the MOS transistor 400 depends on the MOS threshold voltage $V_{TH}$. However, the MOS threshold voltage $V_{TH}$ may change substantially due to variation of, for example, the source to the body bias voltage $V_{SB}$. The body bias voltage $V_{SB}$ is caused by body effects between the source terminal 408 and the body region 402. The body effects may describe changes in the MOS threshold voltage $V_{TH}$ by the change in a baseband (BB) voltage $V_{BB}$ to the MOS transistor 400. In this regard, the MOS transistor 400 may be operated to improve device performance by controlling the MOS threshold voltage $V_{th}$ and/or dynamically adjusting the baseband (BB) voltage $V_{BB}$.

Figure 5:
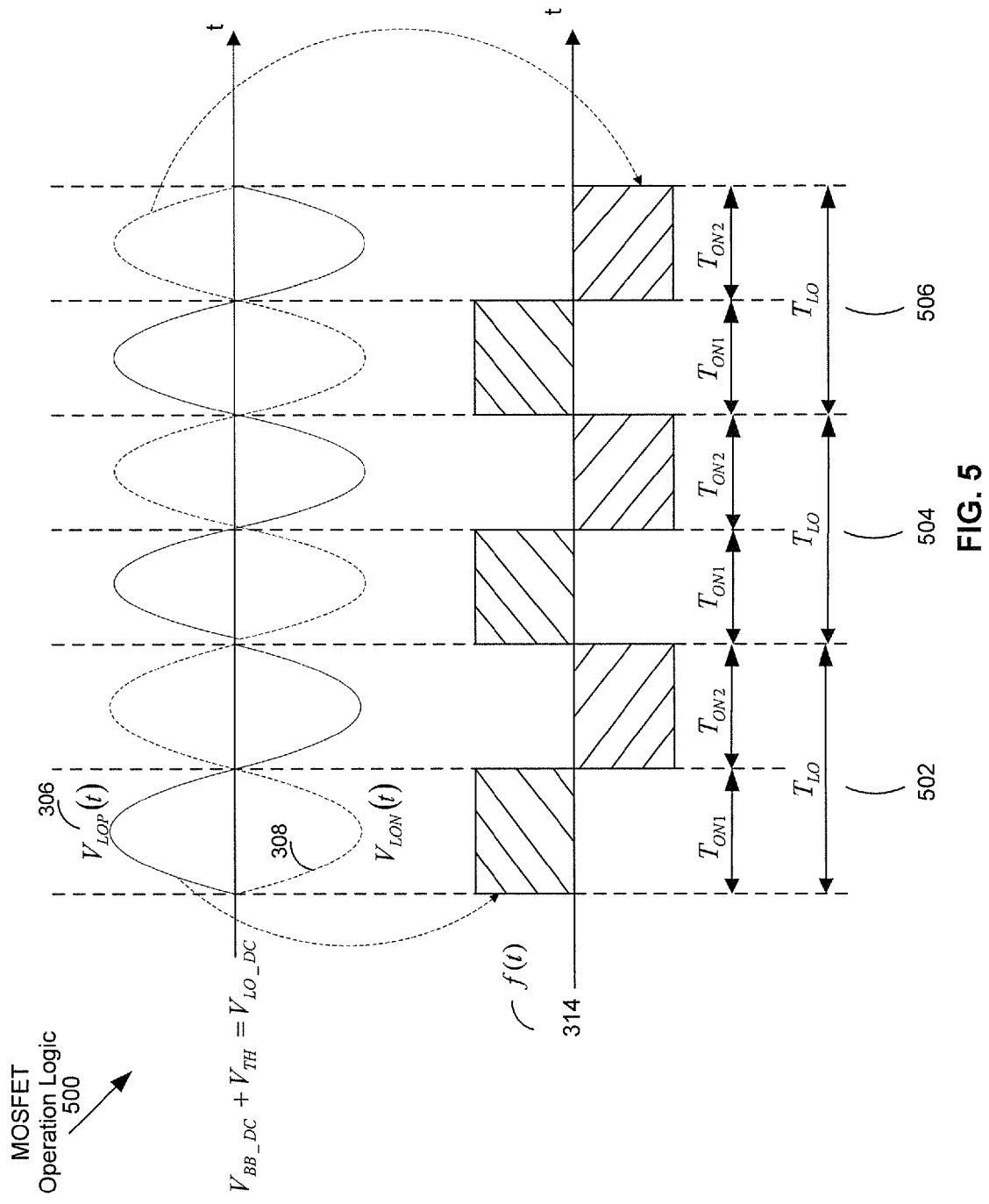
FIG. 5 is a diagram illustrating exemplary operation logic of a MOSFET switch when $V_{LO}(t)$ DC level is set to be equal to $V_{BB\_DC}+V_{TH}$, in accordance with an embodiment of the invention.

FIG. 5 is a diagram illustrating exemplary operation logic of a MOSFET switch when $V_{LO}$ DC level is equal to $V_{BB\_DC}+V_{TH}$, in accordance with an embodiment of the invention. Referring to FIG. 5, there is shown a signal $V_{LOP}(t)$ 306 and a signal $V_{LON}(t)$ 308. As described with respect to FIG. 3, $V_{OUT}(t)=V_{OP}(t)-V_{ON}(t)=V_{IN}(t)\times f(t)$, where $f(t)\in\{-1,0,+1\}$ 316 is a transfer function which is a pulse train function as illustrated in FIG. 3. The switch core 300 may operate with a switch duty cycle Tswitch. The switch duty cycle Tswitch may be represented as $$T_{Switch} = \frac{T_{ON1} + T_{ON2}}{T_{LO}},$$

where parameters $T_{LO}$ is the LO cycle, $T_{ON1}$ and $T_{ON2}$ are pulse durations corresponding to the output voltage $V_{OP}(t)$ 312a and the output voltage $V_{ON}(t)$ 312b, respectively. The ranges for the $T_{ON1}$ and $T_{ON2}$ may be $$0 \leq T_{ON1} \leq \frac{T_{LO}}{2} \text{ and } 0 \leq T_{ON2} \leq \frac{T_{LO}}{2},$$

respectively.

The switch duty cycle $T_{Switch}$ may be utilized as an indicator to a power level that the passive upconversion mixer 214 may provide for signal transmissions. A switch duty cycle $T_{Switch}$ of 100% may correspond to the maximum gain that the passive upconversion mixer 214 may provide to communicate signals with the PA 212.

The operation of the switching core 300 may be controlled by the received analog LO signals from the LO 240. The received analog LO signals may comprise the signal $V_{LOP}(t)$ 306 and the signal $V_{LON}(t)$ 308. The MOSFET switch 302 and the MOSFET switch 304 may be controlled by the signal $V_{LOP}(t)$ 306 and the signal $V_{LON}(t)$ 308, respectively. In instances where by setting the DC level of the $V_{LO}(t)$ equal to $V_{BB\_DC}+V_{TH}$, the pulse durations $T_{ON1}$ and $T_{ON2}$ of the pulse train 314 for the output voltage $V_{OUT}(t)$ may be $$T_{ON1} = \frac{T_{LO}}{2} \text{ and } T_{ON2} = \frac{T_{LO}}{2}.$$

The switch duty cycle may be $$T_{Switch} = \frac{T_{ON1} + T_{ON2}}{T_{LO}} = 100\%.$$

Accordingly, the maximum gain may be provided by the passive upconversion mixer 214 for signal transmission.

Figure 6:
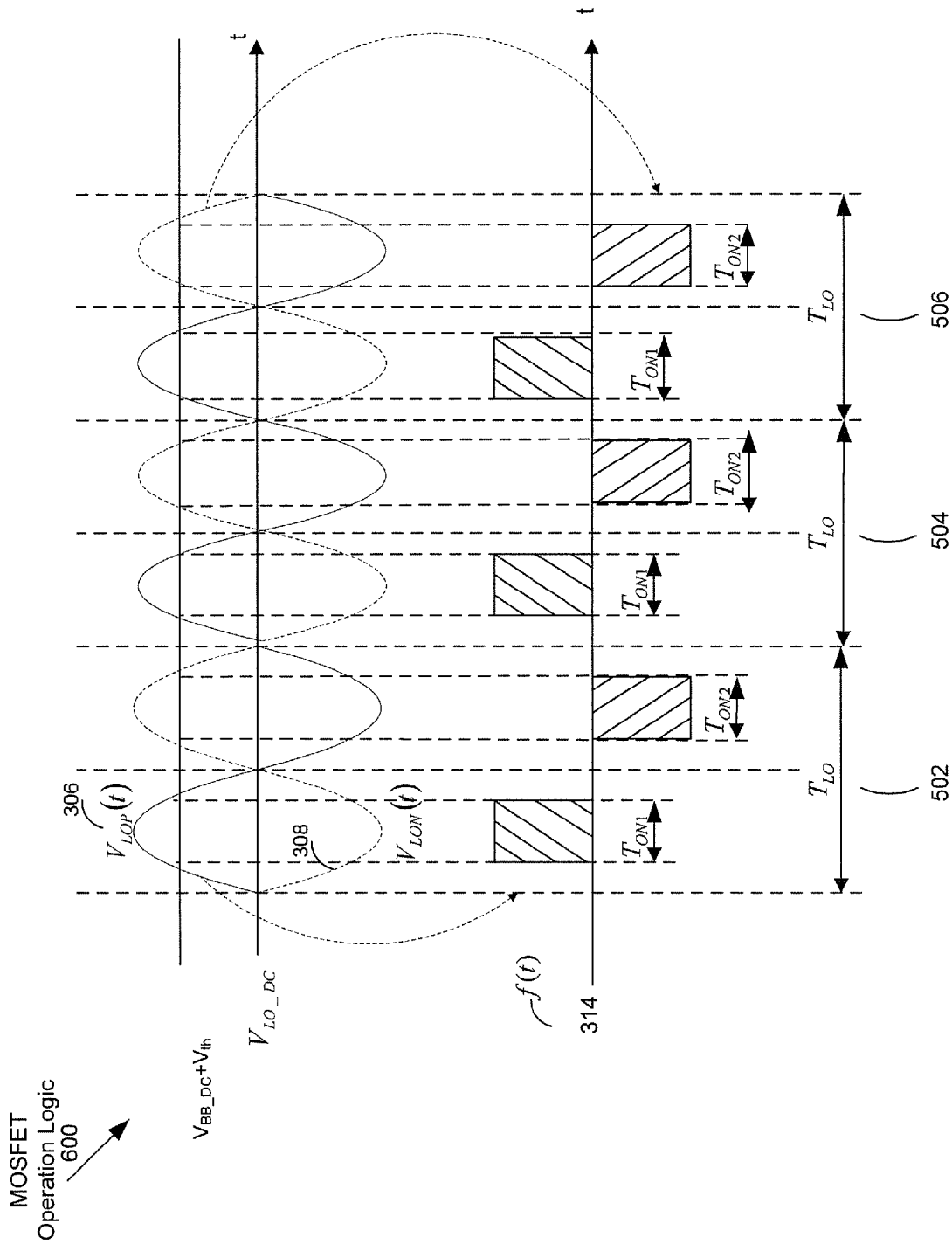
FIG. 6 is a diagram illustrating exemplary operation logic of a MOSFET switch when $V_{LO}(t)$ DC level is set to be less than $V_{BB\_DC}+V_{TH}$, in accordance with an embodiment of the invention.

FIG. 6 is a diagram illustrating exemplary operation logic of a MOSFET switch when $V_{LO}$ DC level is set to be less than $V_{BB\_DC}+V_{TH}$, in accordance with an embodiment of the invention. $V_{OUT}(t)=V_{OP}(t)-V_{ON}(t)=V_{IN}(t)\times f(t)$, where $f(t)\in\{-1,0,+1\}$ 316 is a transfer function which is a pulse train function with switch duty cycle defined as $$T_{Switch} = \frac{T_{ON1} + T_{ON2}}{T_{LO}}.$$

Referring to FIG. 6, there is shown that in instances where the DC level of the $V_{LO}$ is set to be less than $V_{BB\_DC}+V_{TH}$, the pulse durations $T_{ON1}$ and $T_{ON2}$ of the pulse train 314 for the output voltage $V_{OUT}(t)$ may be less than $$\frac{T_{LO}}{2}.$$

The switch duty cycle may be $$T_{Switch} = \frac{T_{ON1} + T_{ON2}}{T_{LO}} < 100\%.$$

Accordingly, the power provided by the passive upconversion mixer 214 for signal transmission is below the maximum gain of the passive upconversion mixer 214.

Figure 7:
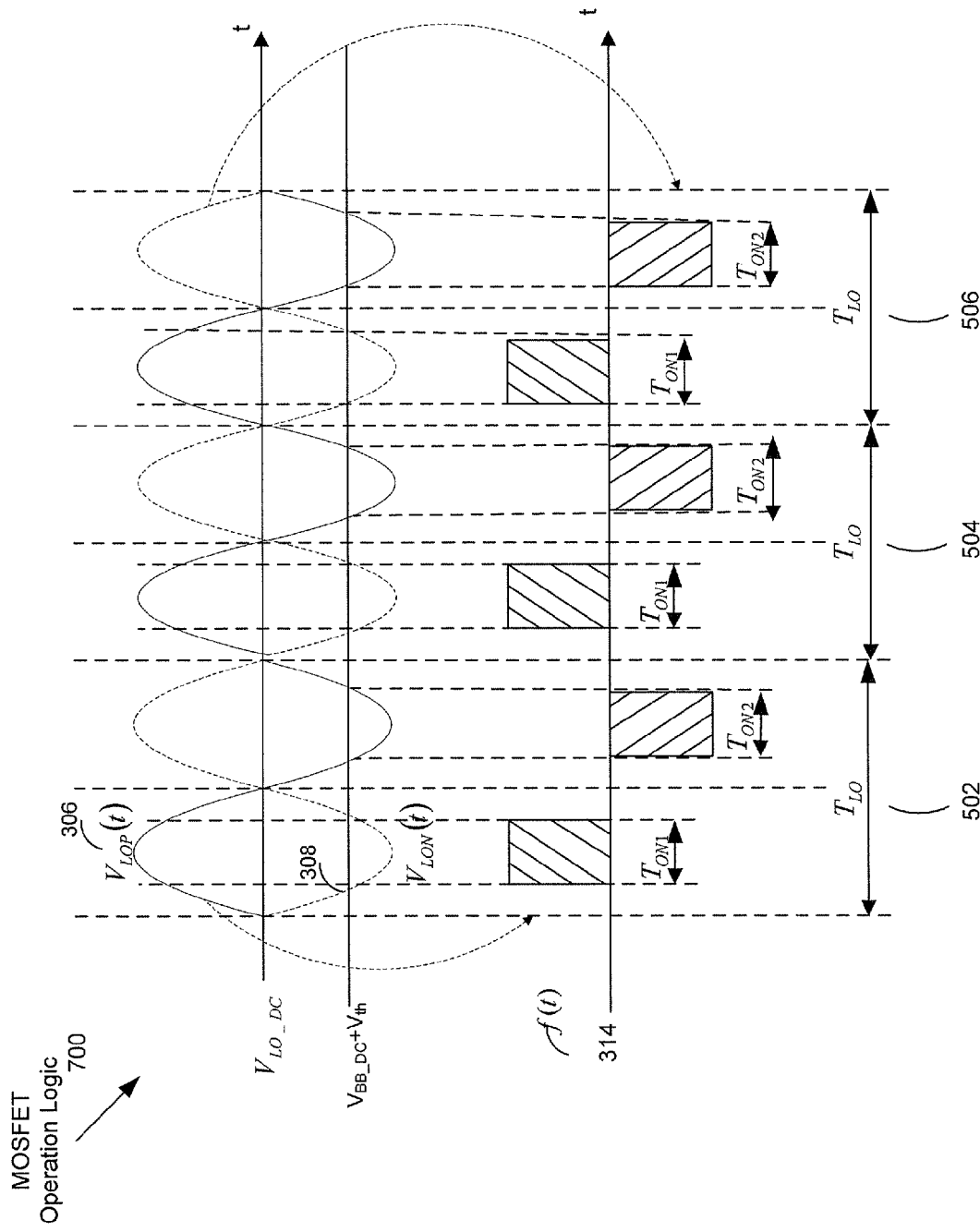
FIG. 7 is a diagram illustrating exemplary operation logic of a MOSFET switch when $V_{LO}(t)$ DC level is set to be greater than $V_{BB\_DC}+V_{TH}$, in accordance with an embodiment of the invention.

FIG. 7 is a diagram illustrating exemplary operation logic of a MOSFET switch when $V_{LO}(t)$ DC level is set to be greater than $V_{BB\_DC}+V_{TH}$, in accordance with an embodiment of the invention. Referring to FIG. 7, there is shown that in instances where a DC level of the $V_{LO}(t)$ is set to be greater than $V_{BB\_DC}+V_{TH}$.

In the first half of the LO cycle of the output voltage $V_{OUT}(t)$ 314, in instances when the MOSFET switch 302a is ON, the MOSFET switch 304a is OFF, the MOSFET switch 302b is OFF and the MOSFET switch 304b is ON, $V_{OUT}(t) = V_{OP}(t) - V_{ON}(t) = (V_{SP}(t) - V_{SN}(t))(+1) = V_{IN}(t) \times (+1)$. In instances when the MOSFET switch 302a is ON, the MOSFET switch 304a is ON, the MOSFET switch 302b is ON and the MOSFET switch 304b is ON, $V_{OUT}(t) = V_{OP}(t) - V_{ON}(t) = 0 = V_{IN}(t) \times (0)$. In instances when the MOSFET switch 302a is OFF, the MOSFET switch 304a is OFF, the MOSFET switch 302b is OFF and the MOSFET switch 304b is OFF, $V_{OUT}(t) = V_{OP}(t) - V_{ON}(t) = 0 = V_{IN}(t) \times (0)$. In the second of the half LO cycle of the output voltage $V_{OUT}(t)$ 314, in instances when the MOSFET switch 302a is OFF, the MOSFET switch 304a is ON, the MOSFET switch 302b is ON and the MOSFET switch 304b is OFF, $V_{OUT}(t) = V_{OP}(t) - V_{ON}(t) = (V_{SN}(t) - V_{SP}(t))(+1) = (V_{SP}(t) - V_{SN}(t)) \times (-1) = V_{IN}(t) \times (-1)$. In instances when the MOSFET switch 302a is ON, the MOSFET switch 304a is ON, the MOSFET switch 302b is ON and the MOSFET switch 304b is ON, $V_{OUT}(t) = V_{OP}(t) - V_{ON}(t) = 0 = V_{IN}(t) \times (0)$. In instances when the MOSFET switch 302a is OFF, the MOSFET switch 304a is OFF, the MOSFET switch 302b is OFF and the MOSFET switch 304b is OFF, $V_{OUT}(t) = V_{OP}(t) - V_{ON}(t) = 0 = V_{IN}(t) \times (0)$. Accordingly, $V_{OUT}(t) = V_{OP}(t) - V_{ON}(t) = V_{IN}(t) \times f(t)$, where $f(t) \in \{-1, 0, +1\}$ 316 is the transfer function which is a pulse train function as illustrated in FIG. 3.

Figure 8:
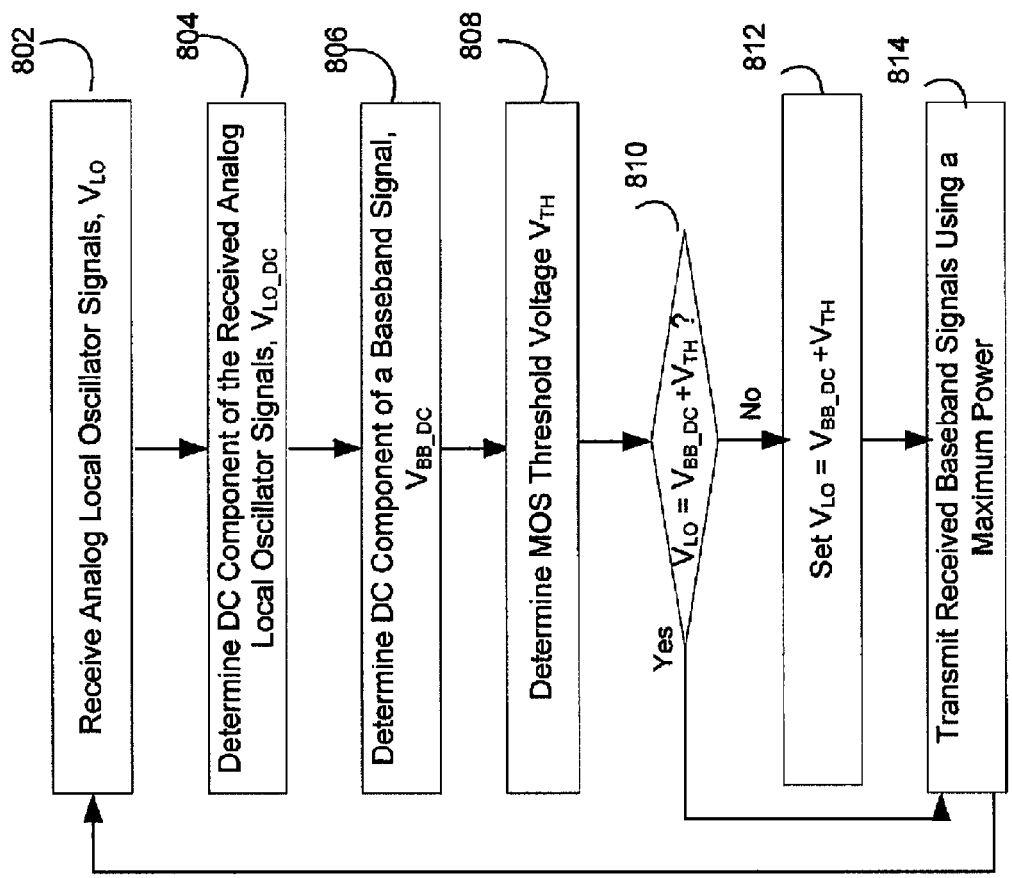
FIG. 8 is a flow chart illustrating exemplary operation logic of a MOSFET switch that is used in a passive upconversion mixer, in accordance with an embodiment of the invention.

FIG. 8 is a flow chart illustrating exemplary operation logic of a MOSFET switch that is used in a passive upconversion mixer, in accordance with an embodiment of the invention. Referring to FIG. 8, the exemplary steps start with step 802, analog local oscillator signals may be received by the MOSFET switch 302 from the LO 240. In step 804, a DC component $V_{LO\_DC}$ of the received analog LO signal $V_{LO}(t)$, may be determined. In step 806, a DC component $V_{BB\_DC}$ of a received baseband signal $V_{BB}(t)$ may be determined. In step 808, a MOS threshold voltage $V_{TH}$ of a MOSFET switch such as the MOSFET switch 302 may be determined based on, for example, device temperature and/or signal. In step 810, it may be determined that if $V_{LO\_DC}$ is equal to $V_{BB\_DC} + V_{TH}$. In instances where $V_{LO\_DC}$ is equal to $V_{BB\_DC} + V_{TH}$, then in step 814, where the passive upconversion mixer 214 may be operable to transmit received baseband signals using a maximum power. The exemplary steps may return to step 802.

In step 810, in instances where $V_{LO\_DC}$ is not equal to $V_{BB\_DC} + V_{TH}$, then in step 812, where the DC component $V_{LO\_DC}$ of the received analog LO signal $V_{LO}(T)$ may be set to $V_{BB\_DC} + V_{TH}$. The exemplary steps continue in step 814.

Aspects of a method and system for obtaining maximum gain of a passive upconversion mixer utilized in a transmitter are provided. In accordance with various embodiments of the invention, a passive upconversion mixer such as the passive upconversion mixer 214 may be utilized in the RF transmitter 200 for transmitting a signal at a frequency specified by, for example, a Bluetooth protocol. The passive upconversion mixer 214 may receive analog local oscillator (LO) signals from the local oscillator 240. The passive upconversion mixer 214 comprises a pair of MOSFET switches such as the MOSFET switch 302 and the MOSFET switch 304. The received analog LO signals may be utilized to control operation of the MOSFET switch 302 and/or the MOSFET switch 304. For example, the MOSFET transistor 302a and the MOSFET transistor 302b of the MOSFET switch 302 may be turned ON or OFF based on, for example, the received analog LO signals. The passive upconversion mixer 214 may be operable to transmit signals with maximum gain of the passive upconversion mixer 214. A MOS threshold voltage $V_{TH}$ may be determined for the MOSFET switch 302 and the MOSFET switch 304, respectively. The passive upconversion mixer 214 is operable to receive an analog baseband signal $V_{BB}(t)$ to the MOSFET switch 302 and/or the MOSFET switch 304 with the determined MOS threshold voltage $V_{TH}$. A DC component $V_{BB\_DC}$ of the received analog baseband signal $V_{BB}(t)$ may be determined for the MOSFET switch 302 and the MOSFET switch 304, respectively. A DC component of the received analog LO signal, $V_{LO\_DC}$, may be compared with a combination, for example, a linear combination, of the determined $V_{TH}$ and the determined baseband DC component $V_{BB\_DC}$. The determined DC component of the received analog LO signal may be set to be equal to the combination of the determined MOS threshold voltage $V_{TH}$ and the DC component $V_{BB\_DC}$ of the received analog baseband signal $V_{BB}(t)$ for the transmission of $V_{BB}(t)$ based on the comparison.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for obtaining maximum gain of a passive upconversion mixer utilized in a transmitter.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:
1. A method for communication, the method comprising:
  transmitting a signal by, at least:
    receiving an analog local oscillator (LO) signal by a passive upconversion mixer, wherein said passive upconversion mixer comprises a pair of metal-oxide-semiconductor field-effect transistor (MOSFET) switches; and controlling operation of each of said pair of metal-oxide-semiconductor field-effect transistor (MOSFET) switches by using said received analog local oscillator signal to enable said transmission of said signal with maximum output power from said passive upconversion mixer at substantially a duty cycle of 100% while a DC component of said received analog local oscillator (LO) signal equals to a combination of a determined metal-oxide-semiconductor threshold voltage and a DC component of a received analog baseband signal.

2. The method according to claim 1, comprising determining said metal-oxide-semiconductor threshold voltage for each of said pair of metal-oxide-semiconductor field-effect transistor (MOSFET) switches.

3. The method according to claim 2, comprising receiving said analog baseband signal at each of said pair of metal-oxide-semiconductor field effect transistor (MOSFET) switches with said determined metal-oxide-semiconductor threshold voltage.

4. The method according to claim 3, comprising determining said DC component of said received analog baseband signal for each of said pair of metal-oxide-semiconductor field-effect transistor (MOSFET) switches.

5. The method according to claim 4, comprising combining said determined metal-oxide-semiconductor (MOS) threshold voltage and said determined DC component of said received analog baseband signal for each of said pair of metal-oxide-semiconductor field-effect transistor (MOSFET) switches.

6. The method according to claim 5, comprising determining said DC component of said received analog local oscillator (LO) signal based on said combination.

7. The method according to claim 6, comprising comparing said determined DC component of said received analog local oscillator (LO) signal with said combination of said determined metal-oxide-semiconductor (MOS) threshold voltage and said DC component of said received analog baseband signal for each of said pair of metal-oxide-semiconductor field-effect transistor (MOSFET) switches.

8. The method according to claim 7, wherein said combination of said determined metal-oxide-semiconductor threshold voltage and said DC component of said received analog baseband signal for each of said pair of metal-oxide-semiconductor field-effect transistor (MOSFET) switches is a linear combination of said determined metal-oxide-semiconductor threshold voltage and said DC component of said received analog baseband signal for each of said pair of metal-oxide-semiconductor field-effect transistor (MOSFET) switches.

9. The method according to claim 7, comprising setting said determined DC component of said received analog local oscillator (LO) signal equal to said combination of said determined metal-oxide-semiconductor threshold voltage and said DC component of said received analog baseband signal for transmitting said received analog baseband signal based on said comparison.

10. The method according to claim 1, wherein said signals are transmitted at a frequency specified by a Bluetooth protocol.

11. A system for communication, the system comprising:
one or more circuits for use in a transmitter, said one or more circuits comprising a passive upconversion mixer comprising a pair of metal-oxide-semiconductor field-effect transistor (MOSFET) switches, wherein said one or more circuits are operable to:
receive an analog local oscillator (LO) signal; and
control operation of each of said pair of metal-oxide-semiconductor field-effect transistor (MOSFET) switches by using said received analog local oscillator signal to enable transmission of a signal with maximum output power from said passive upconversion mixer at substantially a duty cycle of 100% while a DC component of said received analog local oscillator (LO) signal equals to a combination of a determined metal-oxide-semiconductor threshold voltage and a DC component of a received analog baseband signal.

12. The system according to claim 11, wherein said one or more circuits are operable to determine said metal-oxide-semiconductor threshold voltage for each of said pair of metal-oxide-semiconductor field-effect transistor (MOSFET) switches.

13. The system according to claim 12, wherein said one or more circuits are operable to receive said analog baseband signal at each of said pair of metal-oxide-semiconductor field-effect transistor (MOSFET) switches with said determined metal-oxide-semiconductor threshold voltage.

14. The system according to claim 13, wherein said one or more circuits are operable to determine said DC component of said received analog baseband signal for each of said pair of metal-oxide-semiconductor field-effect transistor (MOSFET) switches.

15. The system according to claim 14, wherein said one or more circuits are operable to combine said determined metal-oxide-semiconductor (MOS) threshold voltage and said determined DC component of said received analog baseband signal for each of said pair of metal-oxide-semiconductor field-effect transistor (MOSFET) switches.

16. The system according to claim 15, wherein said one or more circuits are operable to determine said DC component of said received analog local oscillator (LO) signal based on said combination.

17. The system according to claim 16, wherein said one or more circuits are operable to compare said determined DC component of said received analog local oscillator (LO) signal with said combination of said determined metal-oxide-semiconductor (MOS) threshold voltage and said DC component of said received analog baseband signal for each of said pair of metal-oxide-semiconductor field-effect transistor (MOSFET) switches.

18. The system according to claim 17, wherein said combination of said determined metal-oxide-semiconductor threshold voltage and said DC component of said received analog baseband signal for each of said pair of metal-oxide-semiconductor field-effect transistor (MOSFET) switches is a linear combination of said determined metal-oxide-semiconductor threshold voltage and said DC component of said received analog baseband signal for each of said pair of metal-oxide-semiconductor field-effect transistor (MOSFET) switches.

19. The system according to claim 17, wherein said one or more circuits are operable to set said determined DC component of said received analog local oscillator (LO) signal equal to said combination of said determined metal-oxide-semiconductor threshold voltage and said DC component of said received analog baseband signal for transmitting said received analog baseband signal based on said comparison.

20. The system according to claim 11, wherein said baseband signals are transmitted at a frequency specified by a Bluetooth protocol.

* * * * *